US009377702B2

(12) United States Patent
Kawamura

(10) Patent No.: US 9,377,702 B2
(45) Date of Patent: Jun. 28, 2016

(54) PATTERNING METHOD, LITHOGRAPHY APPARATUS AND SYSTEM, AND ARTICLE MANUFACTURING METHOD

(71) Applicant: CANON KABUSHIKI KAISHA, Tokyo (JP)

(72) Inventor: Akihiko Kawamura, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/601,658

(22) Filed: Jan. 21, 2015

(65) Prior Publication Data

US 2015/0205211 A1   Jul. 23, 2015

(30) Foreign Application Priority Data

Jan. 23, 2014   (JP) .................. 2014-010735

(51) Int. Cl.
  *G03B 27/52*   (2006.01)
  *G03F 9/00*    (2006.01)
  *G03F 7/20*    (2006.01)

(52) U.S. Cl.
  CPC .......... *G03F 9/7003* (2013.01); *G03F 7/70633* (2013.01)

(58) Field of Classification Search
  CPC .................. G03F 7/70633; G03F 7/70141
  USPC ................... 355/52–54, 67, 77; 356/399–401
  See application file for complete search history.

(56) References Cited

U.S. PATENT DOCUMENTS

| 6,552,775 B1* | 4/2003 | Yanagihara ......... G06F 7/70225 250/492.2 |
| 6,898,306 B1* | 5/2005 | Lu .......................... G06T 7/0024 382/151 |
| 2006/0028645 A1* | 2/2006 | Kawamura .......... G03F 7/70633 356/399 |

FOREIGN PATENT DOCUMENTS

JP   2000323383 A   11/2000

* cited by examiner

*Primary Examiner* — Hung Henry Nguyen
(74) *Attorney, Agent, or Firm* — Rossi, Kimms & McDowell LLP

(57) ABSTRACT

A method of performing patterning of a substrate includes: obtaining, based on first alignment measurement with respect to first patterning, a first compensation value for second alignment measurement, with respect to the first patterning, in which number of alignment marks to be measured is smaller than number of alignment marks to be measured in the first alignment measurement; performing the second alignment measurement with respect to second patterning different from the first patterning; generating, based on a condition with respect to the second patterning and the first compensation value, a second compensation value for the second alignment measurement; and performing the second patterning of a substrate based on the second alignment measurement and the second compensation value.

19 Claims, 5 Drawing Sheets

F I G. 5
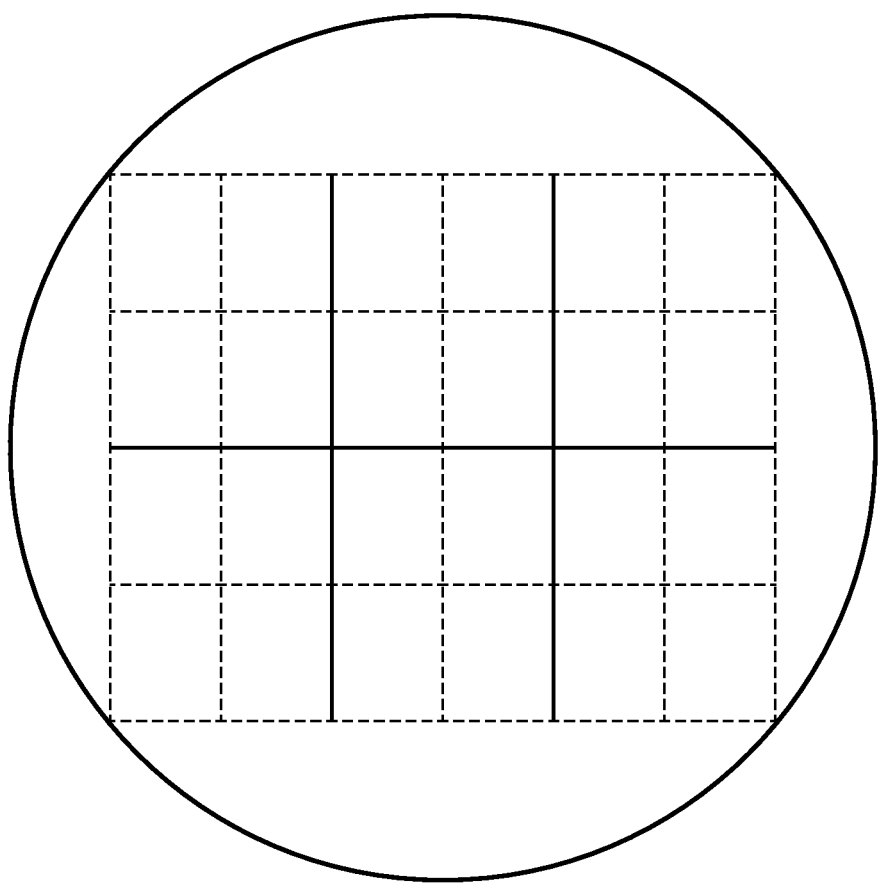

PATTERNING METHOD, LITHOGRAPHY APPARATUS AND SYSTEM, AND ARTICLE MANUFACTURING METHOD

BACKGROUND OF THE INVENTION

1. Field of the Invention

The present invention relates to a patterning method, a lithography apparatus and system, and an article manufacturing method.

2. Description of the Related Art

Lithography apparatuses such as an exposure apparatus (including a charged particle beam drawing apparatus) and an imprint apparatus can measure an alignment mark for each wafer, position the wafer based on the measurement result, and perform patterning. Generally in this alignment measurement, the marks of some shot regions are measured, and the positions of all the respective shot regions are calculated from the measurement values. In the calculation process, the position of a shot region (that can further include the dimensions and shape of the shot region) is calculated by using a predetermined algorithm. For example, when the shapes of shot regions are different at random, it is necessary to measure the marks of all shot regions. In this case, alignment measurement takes a very long time. The measurement time is therefore shortened by a method that uses measured data for the next process.

Japanese Patent Laid-Open No. 2000-323383 has disclosed a technique of applying an alignment measurement result to another process. The technique disclosed in Japanese Patent Laid-Open No. 2000-323383 searches for and applies a measurement result obtained in a process that is the same as or similar to a process, to which the measurement result is applied, in terms of an exposure apparatus or recipe to be used.

However, when a measurement result is applied in the related art, the time taken for alignment measurement can be shortened. However, there is room for improvement of the overlay precision in consideration of the difference in conditions between a process in which the measurement result was obtained, and a process to which the measurement result is applied.

SUMMARY OF THE INVENTION

The present invention provides, for example, a lithography apparatus advantageous in terms of throughput and overlay precision.

The present invention in its one aspect provides a method of performing patterning of a substrate, the method comprising steps of: obtaining, based on first alignment measurement with respect to first patterning, a first compensation value for second alignment measurement, with respect to the first patterning, in which number of alignment marks to be measured is smaller than number of alignment marks to be measured in the first alignment measurement; performing the second alignment measurement with respect to second patterning different from the first patterning; generating, based on a condition with respect to the second patterning and the first compensation value, a second compensation value for the second alignment measurement; and performing the second patterning of a substrate based on the second alignment measurement and the second compensation value.

Further features of the present invention will become apparent from the following description of exemplary embodiments with reference to the attached drawings.

BRIEF DESCRIPTION OF THE DRAWINGS

FIG. 5 is a view showing an example of a shot layout when the lens magnification is doubled in the vertical and horizontal directions.

DESCRIPTION OF THE EMBODIMENTS

Figure 1:
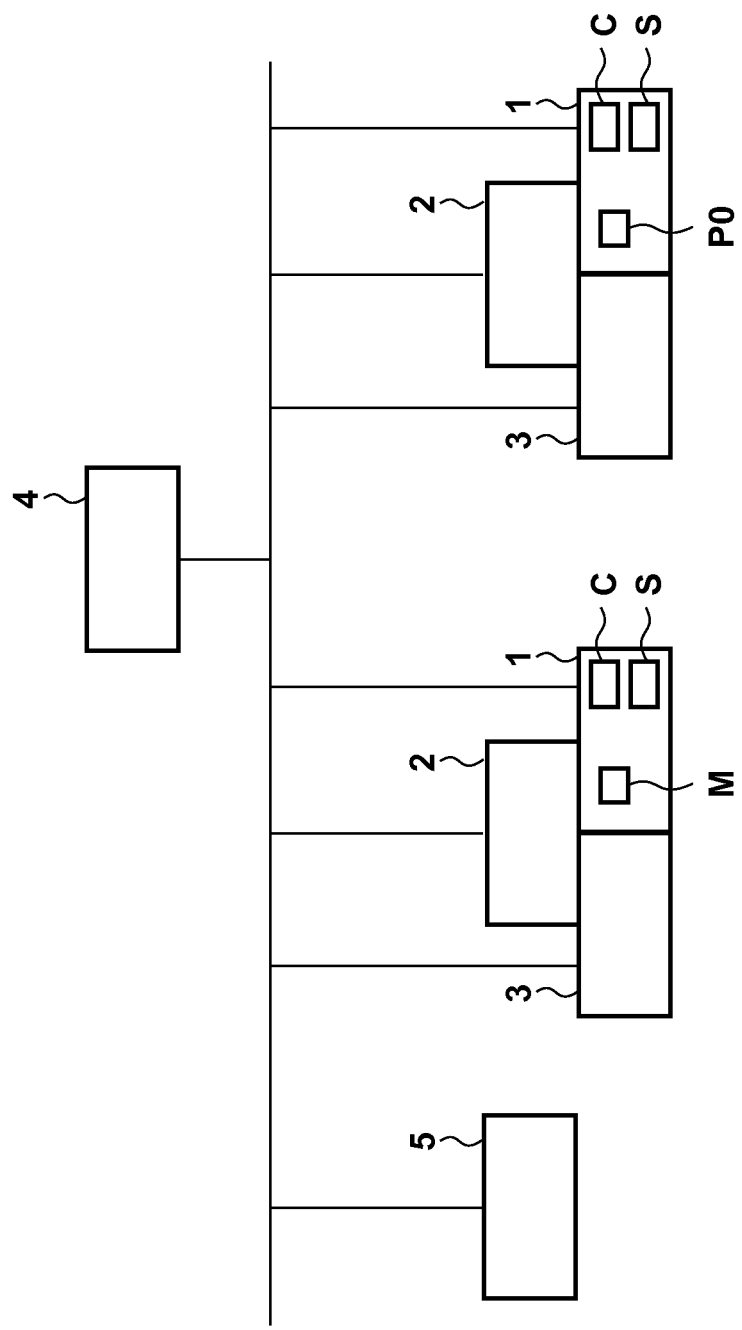
FIG. 1 is a view showing an example of a device manufacturing system.

Embodiments of the present invention will be described with reference to the drawings. FIG. 1 shows a lithography system for manufacturing a device such as a semiconductor device according to the present invention. The lithography system in FIG. 1 includes a plurality of exposure apparatuses 1. Each of the exposure apparatuses 1 performs patterning on a substrate (wafer) by exposing a resist supplied onto the substrate. The exposure apparatus 1 includes a controller C that controls exposure, and a storage S that stores a correction value. The exposure apparatus 1 can be a lithography apparatus including a charged particle beam drawing apparatus that performs patterning by drawing on a substrate with a charged particle beam. Each of a plurality of coating and developing apparatuses 3 coats a wafer with a resist and develops the exposed wafer. Although this embodiment uses the coating and developing apparatus 3, the coating apparatus and the developing apparatus may be separated. The coating and developing apparatus 3 and the exposure apparatus 1 are directly connected in a so-called inline connection form. A control apparatus 4 is constituted by, for example, a host computer, and controls the coating and developing apparatus 3 and the exposure apparatus 1.

A machine controller 2 communicates with the control apparatus 4, the corresponding exposure apparatus 1, and the corresponding coating and developing apparatus 3, and transmits respective processing instructions from the control apparatus 4 to the exposure apparatus 1 and the coating and developing apparatus 3. The control apparatus 4, the machine controller 2, the exposure apparatus 1, and the coating and developing apparatus 3 are connected to each other via a network. A plurality of sets each of the machine controller 2, the exposure apparatus 1 and the coating and developing apparatus 3 can be arranged in a factory, as shown in FIG. 1. The exposure apparatus 1 performs alignment measurement (second alignment measurement) for at least some sample shot regions out of a plurality of shot regions of a wafer to be exposed. The exposure apparatus 1 obtains data of positional deviations of the respective shot regions based on the results of alignment measurement in the respective sample shot regions.

The positional deviations of the respective shot regions of a wafer can be generated from the measurement results of alignment measurement (first alignment measurement) for the respective shot regions. That is, the number of alignment marks measured in the second alignment measurement is smaller than the number of alignment marks measured in the first alignment measurement. First positional deviation values (also called first positional deviation coefficients) based on the results of the first alignment measurement targeting all shot regions, and second positional deviation values (also called second positional deviation coefficients) based on the results of the second alignment measurement targeting sample shot regions are different. The difference between the first positional deviation value and the second positional deviation value is set as the first compensation value. In this case, the first positional deviation value is the sum of the second positional deviation value and first compensation value. The exposure apparatus 1 generates the first compensation value for each shot region by calculating the difference between the first positional deviation value and the second positional deviation value that are respectively generated based on the results of the first alignment measurement and second alignment measurement. The exposure apparatus transmits the generated first compensation value to a storage apparatus 5 together with exposure conditions (conditions with respect to patterning) or information for specifying them. The storage apparatus 5 stores the first compensation value transmitted from the exposure apparatus 1 together with the exposure conditions. Although the storage apparatus 5 stores the first compensation value in this embodiment, the storage S in the exposure apparatus 1 may store the first compensation value. The conditions with respect to patterning can be conditions with respect to the difference between regions on a substrate where the first patterning, in which the first compensation value has been obtained, was parallelly performed, and regions on the substrate where the second patterning is to be parallelly performed.

For example, the second positional deviation value can be a coefficient of a predetermined order or smaller, for example, a coefficient of a first-order term in a polynomial representing the positional deviation of each shot region. In this case, the first compensation value includes at least one of an offset value of the coefficient, and a coefficient of a term of an order higher than the predetermined order, for example, a coefficient of a second- or higher-order term in the polynomial. The second positional deviation value may be information for obtaining the position of each shot region where patterning is performed, and the first compensation value may be at least one of the dimensions and shape of each shot region where patterning is performed. For example, the second positional deviation value may include a shift component and a rotation component, and the first compensation value may include a magnification component and an orthogonality component.

The second positional deviation value can be regarded as a value mainly representing an apparatus-specific positional deviation arising from the exposure apparatus 1 or the like. The first compensation value can be regarded as a value representing the positional deviation of a shot arrangement arising from a wafer. The storage apparatus 5 stores the first compensation value together with an identification mark for identifying a wafer used to generate the first and second positional deviation values or the type of wafer, and the exposure conditions (conditions with respect to patterning) of the wafer used to generate the first and second positional deviation values.

Figure 2:
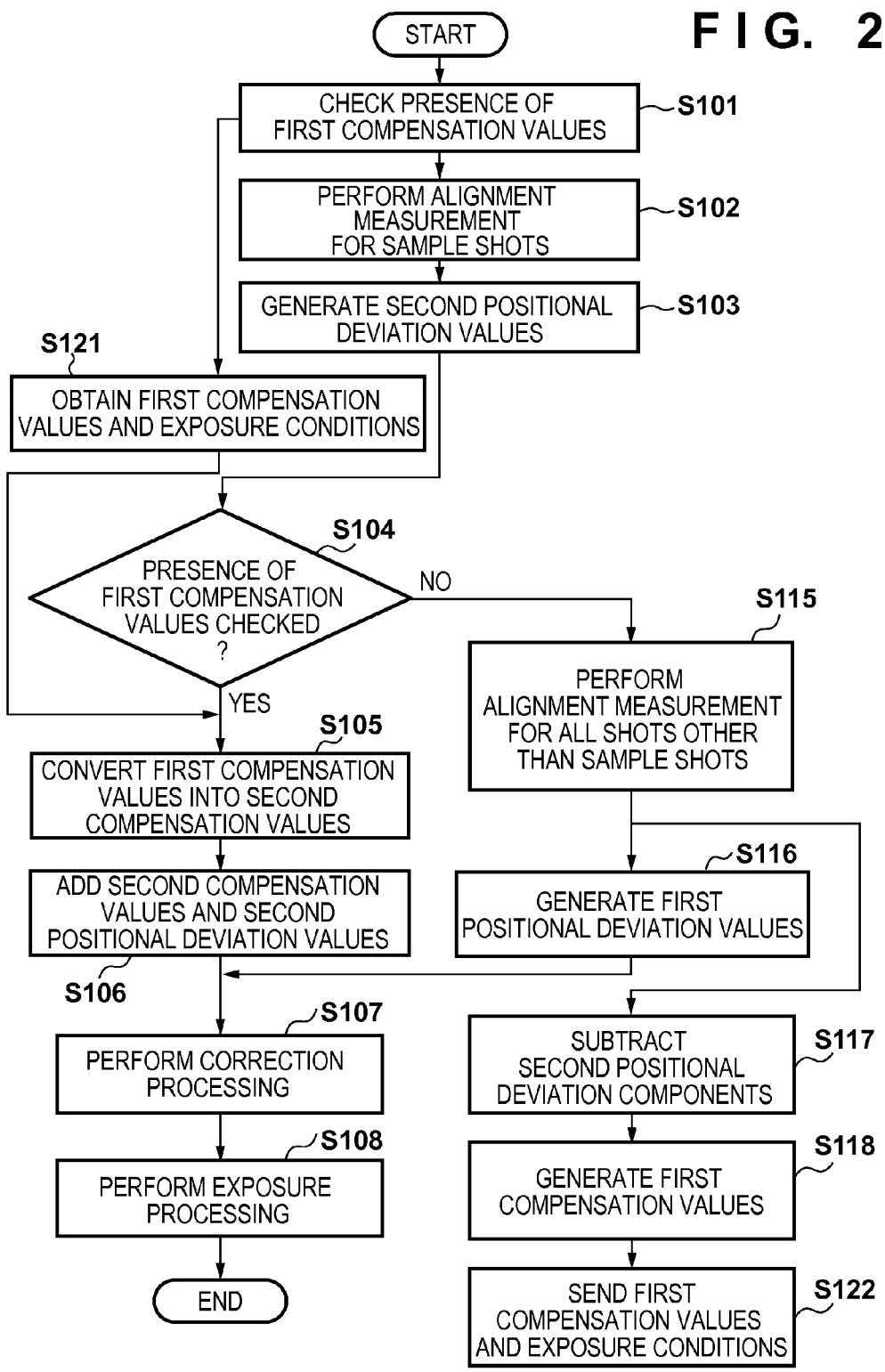
FIG. 2 is a flowchart showing an example of generation of a correction value, and exposure.

FIG. 2 is a flowchart showing an example of generation of the first compensation value, and exposure performed while correcting a positional deviation by using the first compensation value. Generation of the first compensation value, and exposure are executed by the respective apparatuses belonging to the system shown in FIG. 1. When the system starts processing, the exposure apparatus 1 confirms whether the first compensation values for a wafer to undergo exposure processing have been stored in the storage apparatus 5 (step S101). If the exposure apparatus 1 confirms in step S101 that the first compensation values have been stored in the storage apparatus 5, it obtains the first compensation values from the storage apparatus 5 together with exposure conditions (con-ditions with respect to the second patterning) (step S121). The exposure apparatus 1 performs step S121 parallel to steps S102 and S103 to be described later.

The exposure apparatus 1 performs alignment measurement (second alignment measurement) for some sample shot regions out of a plurality of shot regions formed on a wafer held on a stage (step S102). The alignment measurement in step S102 is performed regardless of the confirmation result in step S101. The exposure apparatus 1 generates second positional deviation values by using the results of alignment measurement for the sample shot regions (step S103).

The exposure apparatus 1 confirms again whether the first compensation values have been stored in the storage apparatus 5 (step S104). If the exposure apparatus 1 confirms in step S104 that the first compensation values have been stored in the storage apparatus 5, it has already obtained the first compensation values from the storage apparatus 5 together with the exposure conditions in step S121. Hence, in the flowchart of FIG. 2, the execution time of step S121 can be shortened by performing step S121 parallel to steps S102 and S103.

The first compensation values change depending on the exposure conditions of a wafer used to generate the first compensation values. As will be described later, the exposure conditions that change the first compensation values are, for example, the projection magnification of a projection optical system PO, the dimensions of a mold M, and a region (shot layout including the size and arrangement of shot regions) on a substrate in patterning (second patterning) to be performed.

The exposure apparatus 1 generates second compensation values by converting, in accordance with the conditions of the current patterning, the first compensation values of the patterning (first patterning) performed first that has been obtained in step S121 (step S105). For example, assume that the first compensation values stored in the storage apparatus 5 are obtained from shot regions generated at a lens magnification of 1:4, and the lens magnification for generating shot regions in the current exposure processing is 1:2. In this case, the exposure apparatus 1 converts the first compensation values obtained in step S121 into second compensation values complying with a shot layout for the lens magnification of 1:2 (step S105). After that, the exposure apparatus 1 generates positional deviation correction values by adding the second positional deviation values generated in step S103 for a wafer to undergo the current exposure processing, and the second compensation values generated in step S105 (step S106). This positional deviation correction value is a value corresponding to the first positional deviation value. The exposure apparatus 1 performs positioning correction by using the positional deviation correction values obtained in step S106 (step S107), and then performs exposure processing (step S108). The wafer having undergone the exposure processing in step S108 for all shot regions is transferred to the coating and developing apparatus 3, and undergoes development processing by the coating and developing apparatus 3.

If it is determined in step S104 that the first compensation values have not been stored in the storage apparatus 5, the exposure apparatus 1 performs alignment measurement for all shot regions other than sample shot regions (step S115). The exposure apparatus 1 generates first positional deviation values for all the respective shot regions of the wafer having undergone the exposure processing in steps S102 and S115 (step S116). The exposure apparatus 1 performs positioning correction for the respective shot regions by using the first positional deviation values of the respective shot regions that have been calculated in step S116 (step S107), and then performs exposure processing (step S108).

Parallel to step S116, the exposure apparatus 1 subtracts, from positional deviation components obtained from the alignment measurement results of all the shot regions, second positional deviation components obtained from the alignment measurement results of the sample shot regions (step S117). The exposure apparatus 1 generates first compensation values by using the positional deviation components obtained in step S117 (step S118), and transmits the generated first compensation values to the storage apparatus 5 together with the identification mark and exposure conditions of the wafer used to generate the first compensation values (step S122). The storage apparatus 5 stores the first compensation values, and the identification mark and exposure conditions of the wafer used to generate the first compensation values, which have been transmitted from the exposure apparatus 1. The first compensation values stored in the storage apparatus 5 are used when performing another process on the wafer used to generate the first compensation values, or when performing exposure processing on another wafer of the same type.

Figure 3:
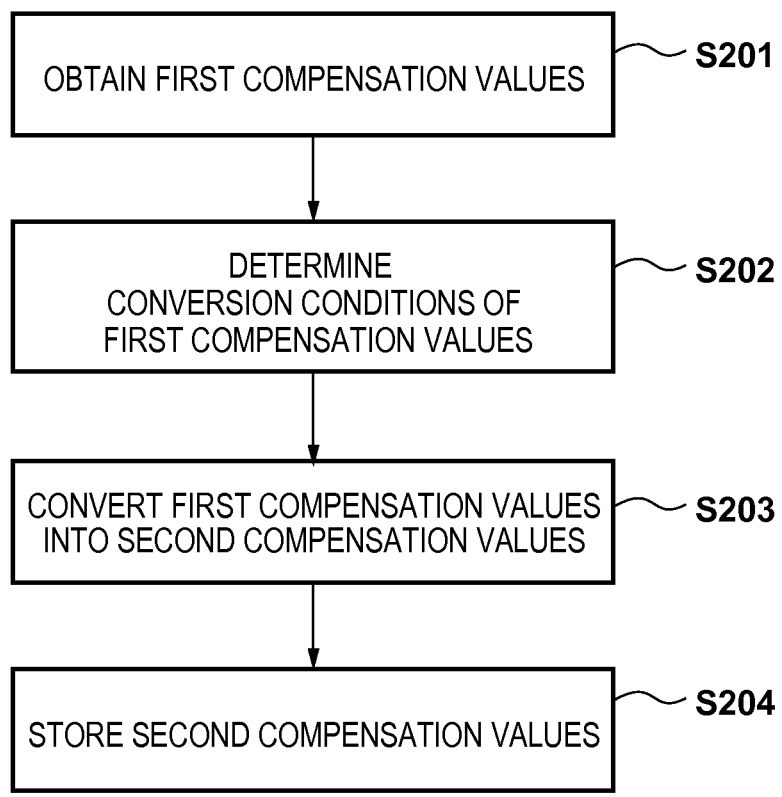
FIG. 3 is a flowchart showing another example of conversion of a correction value.

FIG. 3 shows an example of a flowchart when steps S121 and S105 are performed by an apparatus other than the exposure apparatus 1, for example, the storage apparatus 5. The storage apparatus 5 obtains the first compensation values from the exposure apparatus 1 (step S201), and determines exposure conditions serving as the conversion conditions of the first compensation values (step S202). For example, when it is predicted that the shot layout in the next process is different from the layout in the process in which the first compensation values have been obtained, the storage apparatus 5 generates the second compensation values by converting the first compensation values using the predicted shot layout (step S203). The storage apparatus 5 stores the generated second compensation values (step S204).

Figure 4:
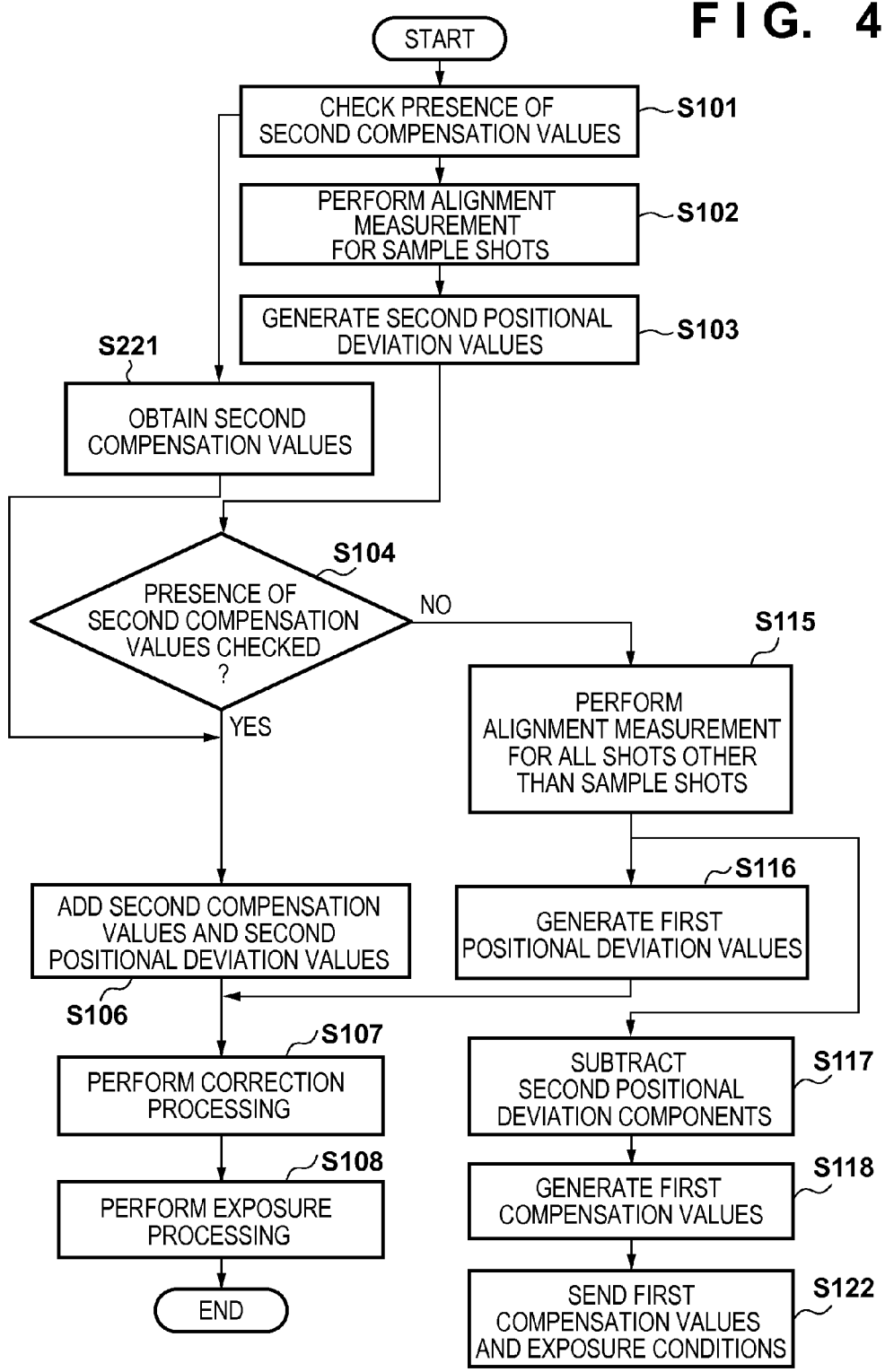
FIG. 4 is a flowchart showing another example of generation of a correction value, and exposure.

FIG. 4 shows an example of a flowchart when the exposure apparatus 1 obtains the second compensation values from the storage apparatus 5, instead of generating the second compensation values. When the exposure apparatus 1 starts processing, it checks whether the second compensation values for a wafer to undergo exposure processing exist in the storage apparatus 5 (step S101). If the second compensation values exist in the storage apparatus 5, the exposure apparatus 1 obtains the second compensation values from the storage apparatus 5 (step S221). The second compensation values obtained from the storage apparatus 5 by the exposure apparatus 1 in step S221 are values that have already undergone conversion accompanying the difference in exposure conditions. Hence, the exposure apparatus 1 does not convert the second compensation values obtained in step S221, but adds them to second positional deviation values generated in step S103, thereby obtaining correction values equivalent to the first positional deviation values of the respective shot regions of a wafer to undergo the current exposure processing (step S106). Then, the exposure apparatus 1 corrects positional deviations for the respective shot regions by using the correction values of the respective shot regions that have been obtained in step S106 (step S107), and performs exposure processing (step S108).

A sequence when the second compensation values do not exist in the storage apparatus 5 is the same as that in FIG. 2.

FIG. 5 shows an example of a shot layout when the lens magnification is doubled in the vertical and horizontal directions. A shot layout drawn by a dotted line indicates a shot layout obtained by exposure by an apparatus having a lens magnification of 4:1. A shot layout drawn by a solid line indicates a shot layout obtained by exposure by an apparatus having a lens magnification of 2:1.

When the shape of the shot regions of one wafer does not change between a plurality of processes, the conventional processing of a correction value measured and obtained for each process is simplified, greatly increasing the processing efficiency of the apparatus. As long as the first compensation values are held as in the present invention, for example, even if exposure conditions such as the shot layout change, corresponding positional deviation correction values can be calculated. In addition, the first compensation values can be shared between a plurality of exposure apparatuses. This can greatly shorten the processing time of the exposure apparatus and greatly increase the processing efficiency of the exposure apparatus.

An article manufacturing method as one aspect of the present invention is suitable for manufacturing an article such as a microdevice (for example, a semiconductor device) or an element having a microstructure. The article manufacturing method according to the embodiment includes a step of transferring a pattern (latent image pattern) to a resist applied to a substrate by using the exposure apparatus or the charged particle beam drawing apparatus, and a step of developing (processing) the substrate on which the latent image pattern has been transferred in the preceding step. Further, this manufacturing method can include other well-known steps (for example, oxidization, deposition, vapor deposition, doping, planarization, etching, resist removal, dicing, bonding, and packaging). The article manufacturing method according to the embodiment is superior to a conventional method in at least one of the performance, quality, productivity, and production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-010735, filed Jan. 23, 2014, which is hereby incorporated by reference herein in its entirety.

What is claimed is:

1. A method of performing patterning of a substrate, the method comprising steps of:
    obtaining, based on first alignment measurement with respect to first patterning, a first compensation value for second alignment measurement, with respect to the first patterning, in which number of alignment marks to be measured is smaller than number of alignment marks to be measured in the first alignment measurement;
    performing the second alignment measurement with respect to second patterning different from the first patterning;
    generating, based on a condition with respect to the second patterning and the first compensation value, a second compensation value for the second alignment measurement with respect to the second patterning; and
    performing the second patterning of a substrate based on the second alignment measurement and the second compensation value.

2. The method according to claim 1, wherein the second alignment measurement obtains a coefficient of a term, of not greater than a predetermined order, of a polynomial for obtaining a position of each shot region on the substrate to undergo the first patterning, and the first compensation value includes at least one of an offset value for the coefficient, and a coefficient, of a term of an order higher than the predetermined order, of the polynomial.

3. The method according to claim 1, wherein the second alignment measurement obtains information for obtaining a position of each shot region on the substrate to undergo the first patterning, and the first compensation value relates to at least one of a dimension and shape of each shot region on the substrate to undergo the first patterning.

4. The method according to claim 1, wherein the second compensation value relates to at least one of a dimension and shape of each region on the substrate where the second patterning is performed in parallel.

5. The method according to claim 1, wherein the condition relates to a discrepancy between a region on the substrate where the first patterning is performed in parallel and a region on the substrate where the second patterning is performed in parallel.

6. The method according to claim 1, wherein the condition relates to at least one of a projection magnification of a projection optical system used in the second patterning, a dimension of a mold used in the second patterning, and a region on the substrate where the second patterning is performed in parallel.

7. A lithography apparatus for performing patterning of a substrate, the apparatus comprising a controller configured to:
obtain, based on first alignment measurement with respect to first patterning, a first compensation value for second alignment measurement, with respect to the first patterning, in which number of alignment marks to be measured is smaller than number of alignment marks to be measured in the first alignment measurement;
generate, based on a condition with respect to second patterning different from the first patterning and the first compensation value, a second compensation value for the second alignment measurement with respect to the second patterning; and
control the second patterning based on the second alignment measurement and the second compensation value.

8. The apparatus according to claim 7, wherein the controller is configured such that the second alignment measurement obtains a coefficient of a term, of not greater than a predetermined order, of a polynomial for obtaining a position of each shot region on the substrate to undergo the first patterning, and the first compensation value includes at least one of an offset value for the coefficient, and a coefficient of a term, of an order higher than the predetermined order, of the polynomial.

9. The apparatus according to claim 7, wherein the controller is configured such that the second alignment measurement obtains information for obtaining a position of each shot region on the substrate to undergo the first patterning, and the first compensation value relates to at least one of a dimension and shape of each shot region on the substrate to undergo the first patterning.

10. The apparatus according to claim 7, wherein the controller is configured such that the second compensation value relates to at least one of a dimension and shape of each region on the substrate where the second patterning is performed in parallel.

11. The apparatus according to claim 7, wherein the controller is configured such that the condition relates to a discrepancy between a region on the substrate where the first patterning is performed in parallel and a region on the substrate where the second patterning is performed in parallel.

12. The apparatus according to claim 7, wherein the controller is configured such that the condition relates to at least one of a projection magnification of a projection optical system used in the second patterning, a dimension of a mold used in the second patterning, and a region on the substrate where the second patterning is performed in parallel.

13. The apparatus according to claim 7, wherein the controller includes a storage, and is configured to obtain the first compensation value based on the first alignment measurement, and store the first compensation value in the storage.

14. The apparatus according to claim 13, wherein the storage is configured to store the first compensation value with one of the condition and information for specifying the condition.

15. A method of manufacturing an article, the method comprising steps of:
performing patterning of a substrate using a lithography apparatus; and
processing the substrate, of which the patterning has been performed, to manufacture the article,
wherein the lithography apparatus includes a controller configured to:
obtain, based on first alignment measurement with respect to first patterning, a first compensation value for second alignment measurement, with respect to the first patterning, in which number of alignment marks to be measured is smaller than number of alignment marks to be measured in the first alignment measurement;
generate, based on a condition with respect to second patterning different from the first patterning and the first compensation value, a second compensation value for the second alignment measurement with respect to the second patterning; and
control the second patterning based on the second alignment measurement and the second compensation value.

16. A lithography system comprising:
a lithography apparatus for performing patterning of a substrate, the apparatus comprising a controller configured to:
obtain, based on first alignment measurement with respect to first patterning, a first compensation value for second alignment measurement, with respect to the first patterning, in which number of alignment marks to be measured is smaller than number of alignment marks to be measured in the first alignment measurement;
generate, based on a condition with respect to second patterning different from the first patterning and the first compensation value, a second compensation value for the second alignment measurement with respect to the second patterning; and
control the second patterning based on the second alignment measurement and the second compensation value; and
a storage apparatus configured to store at least one of the first compensation value and the second compensation value.

17. The system according to claim 16, wherein the storage apparatus is configured to store the first compensation value with one of a condition with respect to the first patterning and information for specifying the condition.

18. The system according to claim 16, wherein the storage apparatus is configured to store the second compensation value with one of a condition with respect to the second patterning and information for specifying the condition.

19. The system according to claim 16, wherein the system includes a plurality of the lithography apparatus.

* * * * *